US012023938B2

United States Patent
Oh et al.

(10) Patent No.: US 12,023,938 B2
(45) Date of Patent: Jul. 2, 2024

(54) PRINTING METHOD

(71) Applicant: Samsung Display Co., LTD., Yongin-si (KR)

(72) Inventors: Hwa Yeul Oh, Hwaseong-si (KR); Kanguk Kim, Hwaseong-si (KR); Jeongki Kim, Hwaseong-si (KR); Jong-Hoon Kim, Seoul (KR); Jiseong Yang, Suwon-si (KR); Kang Soo Han, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 69 days.

(21) Appl. No.: 17/496,341

(22) Filed: Oct. 7, 2021

(65) Prior Publication Data
US 2022/0219462 A1    Jul. 14, 2022

(30) Foreign Application Priority Data
Jan. 11, 2021    (KR) .................... 10-2021-0003445

(51) Int. Cl.
*B41J 2/21*    (2006.01)
*B41J 2/14*    (2006.01)
*B41J 11/00*    (2006.01)

(52) U.S. Cl.
CPC ........... *B41J 2/2132* (2013.01); *B41J 2/1433* (2013.01)

(58) Field of Classification Search
CPC ...... B41J 2/2114; B41J 2/2117; B41J 2/2132; B41J 2/1443; B41J 11/002
See application file for complete search history.

(56) References Cited

U.S. PATENT DOCUMENTS

| 9,599,856 B2 | 3/2017 | Lee et al. | |
| 2004/0114016 A1* | 6/2004 | Yokoyama | B41J 11/00214 347/102 |
| 2009/0184999 A1* | 7/2009 | Kojima | B41J 3/407 347/40 |
| 2016/0185130 A1* | 6/2016 | Sugai | B41J 11/0015 347/102 |

FOREIGN PATENT DOCUMENTS

KR    10-2016-0015480    2/2016

* cited by examiner

*Primary Examiner* — Jason S Uhlenhake
(74) *Attorney, Agent, or Firm* — KILE PARK REED & HOUTTEMAN PLLC

(57) ABSTRACT

An inkjet printing method includes moving an inkjet head to discharge ink to a substrate including printing row areas, discharging ink to a first printing row area and a second printing row area among the printing row areas, discharging ink to a third printing row area among the printing row areas and the second printing row area, and discharging ink only to the first printing row area.

16 Claims, 8 Drawing Sheets

PRINTING METHOD

CROSS-REFERENCE TO RELATED APPLICATION(S)

This application claims priority to and benefits of Korean Patent Application No. 10-2021-0003445 under 35 U.S.C. § 119, filed on Jan. 11, 2021 in the Korean Intellectual Property Office, the entire contents of which are incorporated herein by reference.

BACKGROUND

1. Technical Field

Embodiments relate to a printing method using a inkjet printer.

2. Description of the Related Art

An organic light emitting display device is a display device capable of self-emission of light, and may generate a color image without an additional light source such as a backlight.

Recently, an organic light emitting display device including a color conversion layer has been researched in order to improve display quality. The color conversion layer may covert a wavelength of a light emitted by a light emitting element. Accordingly, the color conversion layer may convert light emitted by a light emitting element into light having various colors. The color conversion layer may include a wavelength converting particle such as a quantum dot, and a scattering element.

An inkjet printing method may be used to form a color conversion layer including the quantum dot and the scattering element. However, in case of forming the color conversion layer using the inkjet printing method, the scattering element may be precipitated in an inkjet printer. Accordingly, stains may occur in a portion of the color conversion layer.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments provide an inkjet printing method capable of preventing occurrence of the stains in a part of the color conversion layer.

In an embodiment of a inkjet printing method according to the disclosure, the inkjet printing method may include moving an inkjet head to discharge ink to a substrate including printing row areas, discharging ink to a first printing row area and a second printing row area among the printing row areas, discharging ink to a third printing row area among the printing row areas and the second printing row area, and discharging ink only to the first printing row area.

In an embodiment, the inkjet printing method may further include discharging ink to an n−1th printing row area and an nth printing row area among the printing row areas.

In an embodiment, the inkjet printing method may further include discharging ink only to the nth printing row area after the discharging of the ink to the n−1th printing row area and the nth printing row area.

In an embodiment, the ink may be discharged to the n−1th printing row area through a first head of the inkjet head, and the ink may be discharged to the nth printing row area through a second head of the inkjet head.

In an embodiment, in case that the ink is discharged only to the nth printing row area, the ink may be discharged only through a first head of the inkjet head, and the ink may not be discharged through a second head of the inkjet head.

In an embodiment, in case that the ink is discharged only to the first printing row area, the ink may be discharged only through the first head of the inkjet head.

In an embodiment, the inkjet printing method may further include forming a first color filter, a second color filter, and a third color filter on the substrate, and forming a partition wall on the first color filter, the second color filter, and the third color filter, the partition wall including openings.

In an embodiment, the openings may include a first opening, a second opening, and a third opening, and at least one of the openings may be formed in at least one printing row area among the printing row areas.

In an embodiment, the openings may be repeatedly arranged in the printing row areas.

In an embodiment, the inkjet head may include a blue ink printing head, a red ink printing head, and a green ink printing head. The blue ink printing head may discharge ink to the second opening, the green ink printing head may discharge ink to the third opening, and the red ink printing head may discharge ink to the first opening.

In an embodiment, the ink discharged to the openings may include particles.

In an embodiment, the particles may include at least one of a wavelength converting particle and a scattering element.

In an embodiment, the blue ink printing head may discharge ink including the scattering element.

In an embodiment, each of the green ink printing head and the red ink printing head may discharge ink including the wavelength converting particle and the scattering element.

In an embodiment, the scattering element may include titanium oxide.

In an embodiment, the wavelength converting particle may include a quantum dot.

In an embodiment of an inkjet printing method according to the disclosure, the inkjet printing method may include moving an inkjet head to discharge ink on a substrate including printing row areas, discharging ink to a first printing row area, a second printing row area, and a third printing row area among the printing row areas, discharging ink to a fourth printing row area among printing row areas and the second and third printing row area, and discharging ink only to the first printing row area.

In an embodiment, the inkjet printing method may further include discharging ink only to an nth printing row area among the printing row areas.

In an embodiment, in case that the ink is discharged only to the nth printing row area, the ink may be discharged only through a first head of the inkjet head.

In an embodiment, in case that the ink is discharged only to the first printing row area, the ink may be discharged only through the first head of the inkjet head.

According to embodiments of the disclosure, after discharging ink to the first and second printing row areas, ink may be discharged to the second and third printing row areas.

Accordingly, the stains may not occur in the second printing row area.

According to embodiments of the disclosure, after discharging ink to the first and second printing row areas, ink may be discharged only to the first printing row area. Accordingly, the stains may not occur in the first printing row area.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Figure 1:
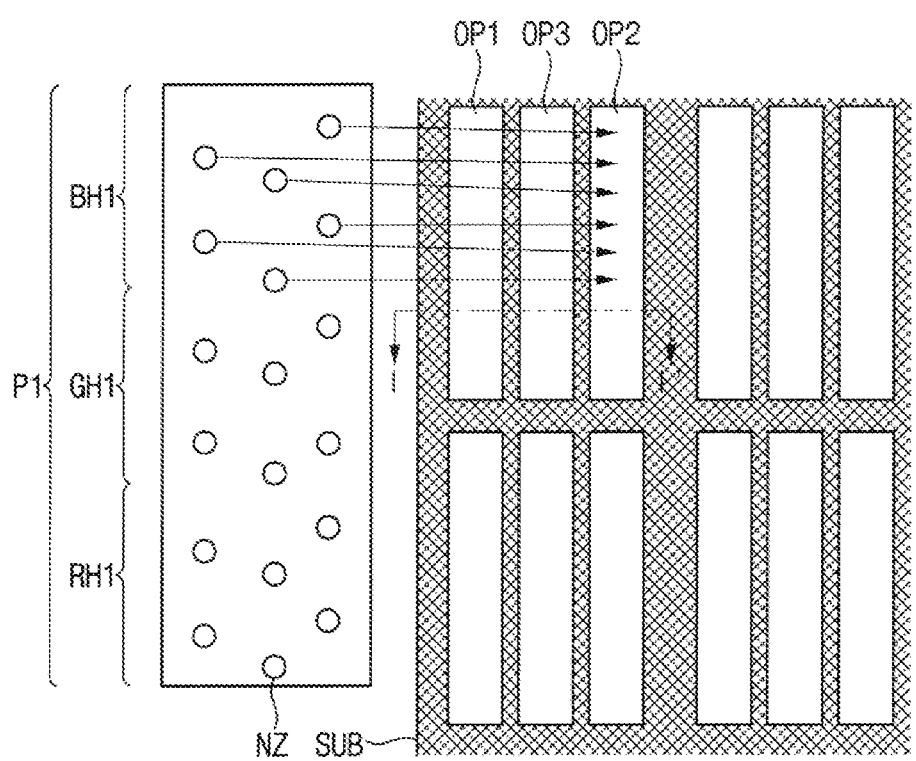
FIG. 1 is a schematic diagram showing an embodiment of an inkjet printing method of the disclosure.

Hereinafter, inkjet printing methods in accordance with embodiments will be explained in detail with reference to the accompanying drawings. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" or "substantially" (e.g., substantially similar) as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Discussion of an element as "optional" should not be used to interpret other elements as mandatory.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
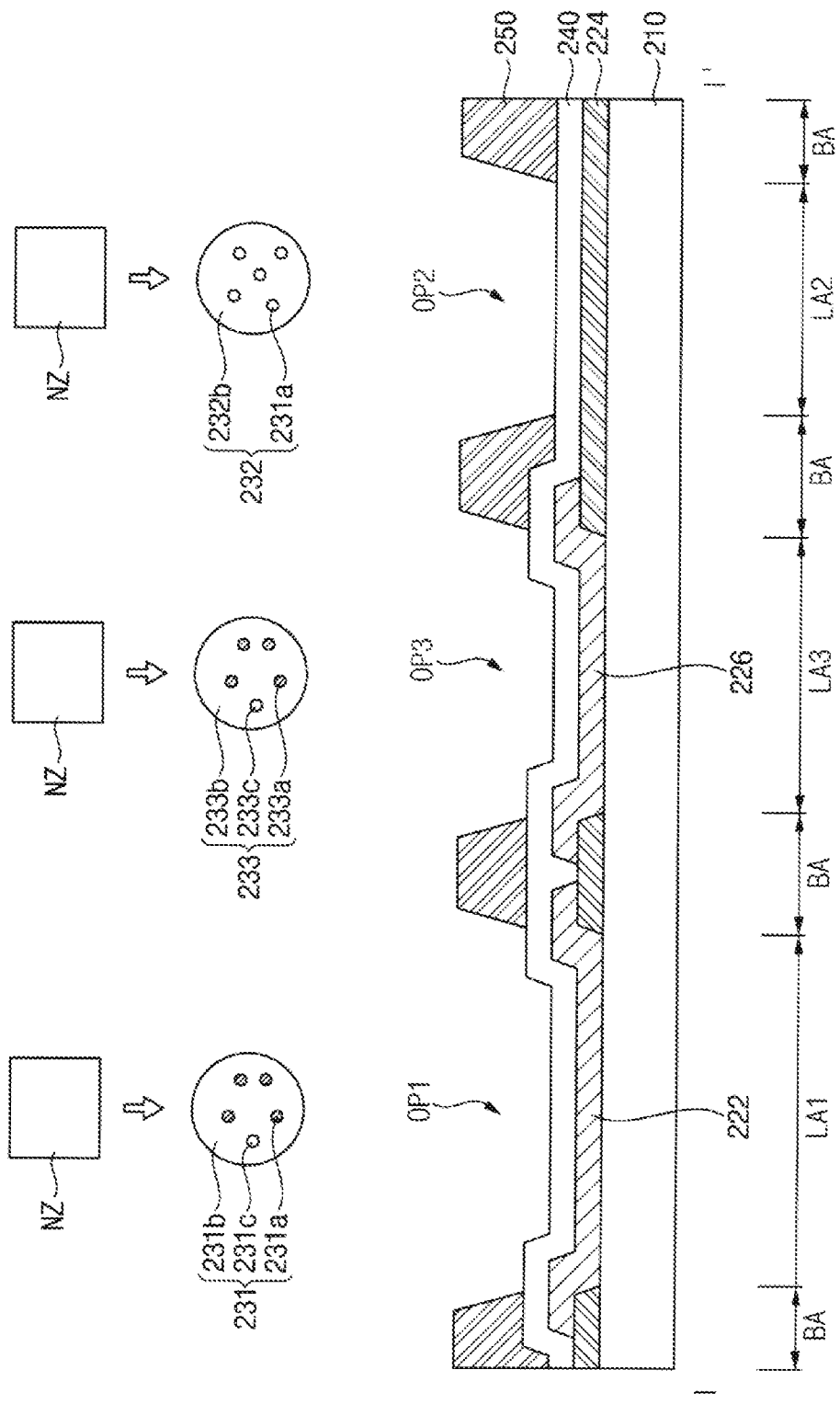
FIG. 2 is a schematic cross-sectional view taken along line of FIG. 1.

FIG. 1 is a schematic diagram showing an embodiment of an inkjet printing method of the disclosure. FIG. 2 is a schematic cross-sectional view taken along line I-I' of FIG. 1.

Referring to FIG. 1, a substrate SUB may include openings. The openings may include first, second, and third openings OP1, OP2, and OP3. Ink including particles may be provided to the first, second, and third openings OP1, OP2, OP3. The particles may include a wavelength converting particle, a scattering element, and combination thereof.

An inkjet printer may be used to provide the ink. The inkjet printer may include an inkjet head including nozzles NZ.

In an embodiment, the inkjet head may include a first head P1. The first head P1 may include a first blue ink printing head BH1, a first green ink printing head GH1, and a first red ink printing head RH1. Each of the first blue ink printing head BH1, the first green ink printing head GH1, and the first red ink printing head RH1 may include the nozzles NZ. Each of the nozzles NZ may discharge the ink.

In other embodiments, the inkjet head may include the first head P1 and a second head having substantially similar elements as the first head P1. Further, the inkjet head may include the first head P1, a second head having substantially similar elements as the first head P1, and a third head having substantially similar elements as the first head P1.

The inkjet printer may provide ink to the openings OP1, OP2, and OP3 through the inkjet head and the nozzles NZ included in the inkjet head. For example, the inkjet printer may include the first red ink printing head RH1 providing ink having a first composition 231 to the first opening OP1, the first blue ink printing head BH1 providing ink having a second composition 232 to the second opening OP2, and the first green ink printing head GH1 providing ink having a third composition 233 to the third opening OP3.

Referring to FIG. 2, the substrate SUB may include a base substrate 210, a first color filter layer 222, a second color filter layer 224, a third color filter layer 226, a protection layer 240, and a partition wall 250. For example, a method of forming the substrate SUB may include providing a base substrate 210, forming the first, second, and third color filter layers 222, 224, and 226 on the base substrate 210, and forming the partition wall 250 including the openings OP1, OP2, and OP3 on the color filter layers 222, 224, and 226. Optionally, forming the protection layer 240 to cover the color filter layers 222, 224, and 226 may be added.

The color filter layers 222, 224, and 226 may be formed to overlap corresponding light emitting areas LA1, LA2, and LA3. For example, the first color filter layer 222 may be formed to overlap the first light emitting area LA1. The second color filter layer 224 may be formed to overlap the second light emitting area LA2. The third color filter layer 226 may be formed to overlap the third light emitting area LA3.

Color of light emitted from the light emitting areas LA1, LA2, and LA3 may be determined by the color filter layers 222, 224, and 226. In an embodiment, the first color filter layer 222 may be formed to overlap the first light emitting area LA1, and may transmit red-light. The second color filter layer 224 may be formed to overlap the second light emitting area LA2, and may transmit blue-light. The third color filter layer 226 may be formed to overlap the third light emitting area LA3, and may transmit green-light.

The protection layer 240 may be formed to cover the color filter layers 222, 224, and 226. The protection layer 240 may include inorganic material such as silicon oxide, silicon nitride, etc.

The partition wall 250 may be formed to be disposed on the protective layer 240. The partition wall 250 may correspond to one or more non-display areas BA. The partition wall 250 may form a space capable of accommodating ink. In an embodiment, the partition wall 250 may have a grid shape or a matrix shape on a plan view. The partition wall 250 may include organic material such as epoxy resin, phenol resin, acrylic resin, silicon resin, etc., or a combination thereof.

In an embodiment, the partition wall 250 may include a light blocking material to serve as a black matrix. For example, at least a portion of the partition wall 250 may include the light blocking material such as a pigment, a dye, carbon black, or a combination thereof.

The nozzles NZ included in the inkjet printer may discharge ink to the space formed in the partition wall 250. For example, ink having the first composition 231 may be provided in the first opening OP1, ink having the second composition 232 may be provided in the second opening OP2, and ink having the third composition 233 may be provided in the third opening OP3.

The first composition 231 and the third composition 233 may include wavelength converting particles 231a and 233a, resin materials 231b and 233b, scattering elements 231c and 233c, binder elements, and solvent. For example, the first composition 231 may include the wavelength converting particle 231a, the resin material 231b, and the scattering element 231c, and the third composition 233 may include the wavelength converting particle 233a, the resin material 233b, and the scattering element 233c.

The wavelength converting particles 231a and 233a may include a quantum dot. The quantum dot may be defined as a semiconductor material having nanocrystal. The quantum dot may have a specific band gap depending on composition and size of the quantum dot. Accordingly, the quantum dot may absorb light and emit light having different wavelength. For example, a diameter of the quantum dot may be about 100 nm or less. In an embodiment, the diameter of the quantum dot may be about 1 nm or more and about 20 nm or less.

The quantum dot may include a group II-VI compound, a group III-V compound, a group IV-VI compound, a group IV element, a group IV compound, and combinations thereof.

For example, the group II-VI compound may be a binary compound selected from the group of CdSe, CdTe, ZnS, ZnSe, ZnTe, ZnO, HgS, HgSe, HgTe, MgSe, MgS, and mixtures thereof; a tertiary compound selected from the group of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof; and a quaternary compound selected from the group of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

For example, the group III-V compound may be a binary compound selected from the group of GaN, GaP, GaAs, GaSb, AlN, AlP, AlAs, AlSb, InN, InP, InAs, InSb, and mixtures thereof; a tertiary compound selected from the group of GaNP, GaNAs, GaNSb, GaPAs, GaPSb, AlNP, AlNAs, AlNSb, AlPAs, AlPSb, InNP, InNAs, InNSb, InPAs, InPSb, GaAlNP, and mixtures thereof; and a quaternary compound selected from the group of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

For example, the grout IV-VI compound may be a binary compound selected from the group of SnS, SnSe, SnTe, PbS, PbSe, PbTe, and mixtures thereof; a tertiary compound selected from the group of SnSeS, SnSeTe, SnSTe, PbSeS, PbSeTe, PbSTe, SnPbS, SnPbSe, SnPbTe, and mixtures thereof; and a quaternary compound selected from the group of SnPbSSe, SnPbSeTe, SnPbSTe, and mixtures thereof.

For example, the group IV element may be selected from the group of Si, Ge, and mixtures thereof. The group IV compound may be a binary compound selected from the group of SiC, SiGe, and mixtures thereof.

For example, the quantum dot may have a core-shell structure including a core and a shell surrounding the core. For example, the core and the shell may contain different materials.

In an embodiment, the wavelength conversion particle 231a included in the first composition 231 may include a quantum dot emitting red-light, and the wavelength conversion particle 233a included in the third composition 233 may include a quantum dot emitting green-light.

The wavelength conversion particles 231a and 233a may be dispersed in the resin materials 231b and 233b. For example, the resin materials 231b and 233b may include epoxy resin, acrylic resin, phenolic resin, melamine resin, cardo resin, imide resin, etc., or a combination thereof.

The first composition 231 and the third composition 233 may include the scattering elements 231c and 233c. The scattering elements 231c and 233c may be selectively omitted. In other words, the first composition 231 and the third composition 233 may optionally not include the scattering elements 231c and 233c. The scattering elements 231c and 233c may scatter light without substantially changing a wavelength of the light.

The scattering elements 231c and 233c may include a metal oxide or an organic material. For example, the metal oxide may include titanium oxide, zirconium oxide, aluminum oxide, indium oxide, zinc oxide, tin oxide, etc., or a combination thereof. The organic material may include acrylic resin or urethane resin.

The binder component may include a polymer, a polymeric monomer, or combination thereof. For example, the polymer may include aromatic ring structure in the main chain. For example, the aromatic ring structure may include phenylene, biphenylene, fluorene, etc., or a combination thereof. The polymeric monomer may include one or more carbon-carbon double bonds. For example, the polymeric monomer may include (meth)acrylate compound.

The solvent may be appropriately selected or combined from a variety of materials in consideration of affinity with other components, dispersibility of the quantum dot, viscosity, boiling point, etc.

The second composition 232 may include substantially similar components as the first composition 231 or the third composition 233, except that the wave conversion particles 231a and 233a may not be included. For example, the second composition 232 may include a scattering element 232a, a resin material 232b, a binder component, and solvent.

The inkjet printer may provide ink including the compositions 231, 232, and 233 corresponding to the openings OP1, OP2, and OP3. Accordingly, the openings OP1, OP2, and OP3 may be filled.

The compositions 231, 232, and 233 filled in the openings OP1, OP2, and OP3 may be cured to form a color conversion layer and a compensation layer. For example, the compositions 231, 232, and 233 may be thermally cured and photocured.

FIG. 3, FIG. 4, FIG. 5, FIG. 6, FIG. 7, and FIG. 8 are schematic diagrams for explaining an inkjet printing method according to an embodiment of the disclosure.

Referring to FIG. 3, FIG. 4, FIG. 5, FIG. 6, FIG. 7, and FIG. 8, by performing steps of positioning an inkjet head IH on a substrate SUB and discharging ink while moving the inkjet head IH, ink may be discharged to the substrate SUB. The substrate SUB may be substantially similar to the substrate SUB described with reference to FIG. 1 and FIG. 2.

The substrate SUB may include first to eighth printing row areas A1, A2, A3, A4, A5, A6, A7 and A8. Each of the first to eighth printing row areas A1, A2, A3, A4, A5, A6, A7 and A8 may extend along a row direction (for example, x-axis direction), and may be arrayed in a column direction (for example, y-axis direction).

Each of the first to eighth printing row areas A1, A2, A3, A4, A5, A6, A7 and A8 may mean a unit area printed by ink discharged through the inkjet head IH.

Openings (for example, the openings OP1, OP2, and OP3 described with reference to FIG. 1 and FIG. 2) may be formed in each of the first to eighth printing row areas A1, A2, A3, A4, A5, A6, A7 and A8. In an embodiment, the openings may be formed to be repeatedly arranged in each of the first to eighth printing row areas A1, A2, A3, A4, A5, A6, A7 and A8. Discharging ink while moving the inkjet head IH may include discharging ink to the openings formed in each of the first to eight printing row areas A1, A2, A3, A4, A5, A6, A7 and A8, and filling the openings.

FIG. 3 to FIG. 8 show an embodiment in which the substrate SUB includes first to eight printing row areas A1, A2, A3, A4, A5, A6, A7 and A8, but the number of printing row areas included in the substrate SUB is not limited thereto. For example, the substrate SUB may include first to $n^{th}$ (where n may be a natural number of 3 or more) printing row areas.

The inkjet head IH may include a first head P1 and a second head P2 adjacent to the first head P1. The first head P1 may be substantially similar to the first head P1 described with reference to FIG. 1. A structure of the second head P2 may be substantially similar to a structure of the first head P1. Accordingly, the inkjet head IH may simultaneously discharge ink to two adjacent printing row areas.

Figure 3:
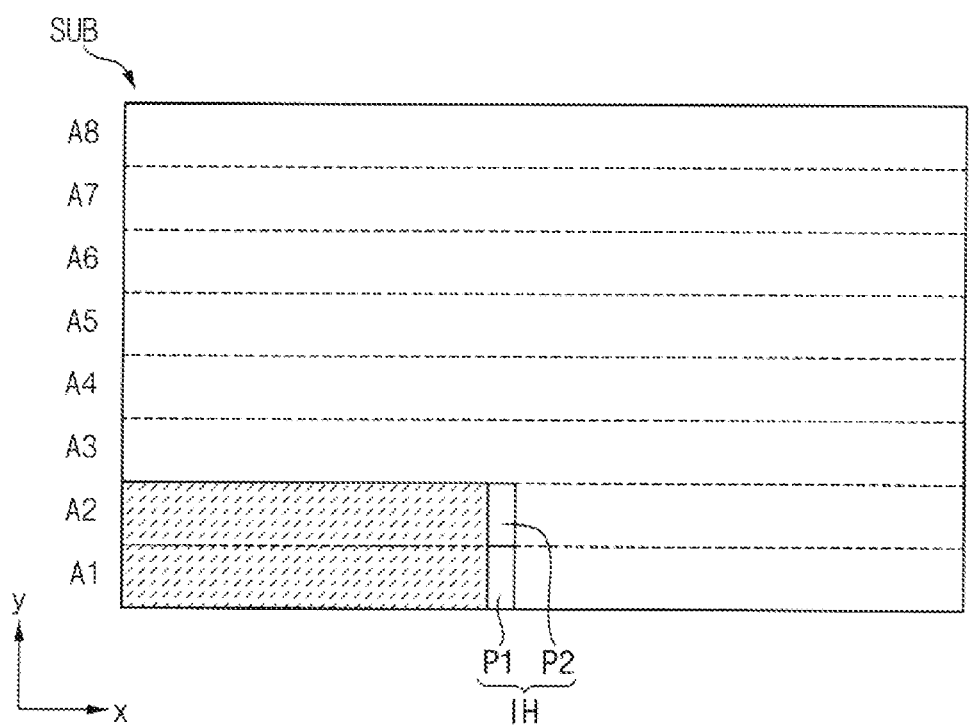
FIG. 3, FIG. 4, FIG. 5, FIG. 6, FIG. 7, and FIG. 8 are schematic diagrams for explaining an inkjet printing method according to an embodiment of the disclosure.

Referring to FIG. 3, after positioning the inkjet head IH for discharging ink to the substrate SUB including the first to eight printing row areas A1, A2, A3, A4, A5, A6, A7 and A8, ink may be discharged to the first and second printing row areas A1 and A2 among the first to eight printing row areas A1, A2, A3, A4, A5, A6, A7 and A8 while moving the inkjet head IH. For example, the first head P1 of the inkjet head IH may discharge ink to the first printing row area A1, and the second head P2 of the inkjet head IH may discharge ink to the second printing row area A2. The inkjet head IH may repeatedly move in a positive x-axis direction or a negative x-axis direction. The inkjet head IH may repeatedly move in a positive y-axis direction or a negative y-axis direction.

In case that ink is discharged to the first and second printing row areas A1 and A2, a composition included in ink may be precipitated in the inkjet head IH. Accordingly, a concentration of the composition may be relatively increased in ink discharged to the first and second printing row areas A1 and A2. In other words, the concentration of the composition may be relatively increased in ink filled in the openings included in the first and second printing areas A1 and A2. Accordingly, stains may be visually recognized in the first and second printing row areas A1 and A2.

For example, referring to FIG. 1, FIG. 2, and FIG. 3, each of the first and second printing areas A1 and A2 may include the openings OP1, OP2, and OP3. Ink having the second composition 232 including a scattering element 232a and a resin material 232b may be discharged to the second opening OP2 among the openings OP1, OP2, and OP3. Ink having the second composition 232 may fill the second opening OP2.

Before ink having the second composition 232 may be discharged, ink including the scattering element 232a may be filled in the inkjet head IH. In case that ink having the second composition 232 is filled in the inkjet head IH for a relatively long time, the scattering element 232a may precipitate in the inkjet head IH. Accordingly, a concentration of the scattering element 232a in ink having the second composition 232 discharged to the second opening OP2 may increase relatively. In case that ink having a relatively high concentration of the scattering body 232a is filled in the second opening OP2, the stains may be visually recognized in the second light emitting area LA2.

In case that the ink having the second composition 232 is continuously discharged through the inkjet head IH, the concentration of the scattering element 232a in discharged ink may gradually decrease and may approach normal concentration. Accordingly, a phenomenon in which the concentration of the scattering element 232a in ink increases relatively due to precipitation of the scattering element 232a may be a problem in initial stage of the inkjet printing method.

Figure 4:
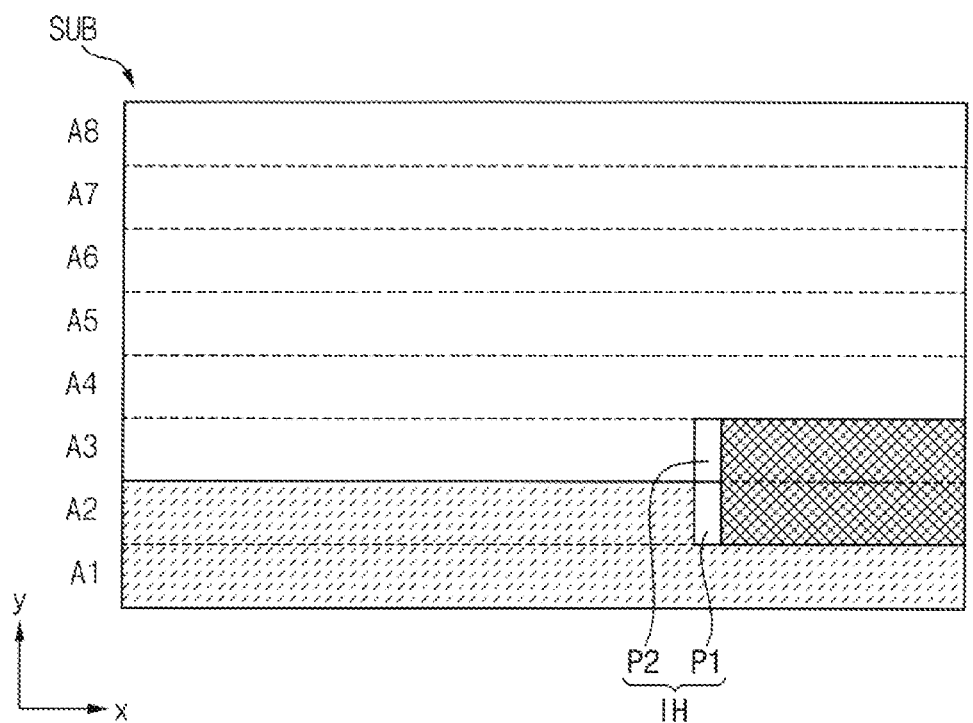

Referring to FIG. 4, after discharging ink to the first and second printing row areas A1 and A2, ink may be discharged to the second printing row area A2 and the third printing row area A3 while moving the inkjet head IH. For example, the first head P1 of the inkjet head IH may discharge ink to the second printing row area A2, and the second head P2 of the inkjet head IH may discharge ink to the third printing row area A3. The inkjet head IH may repeatedly move in the positive x-axis direction or the negative x-axis direction. The inkjet head IH may repeatedly move in the positive y-axis direction or the negative y-axis direction.

In case that ink is discharged to the second and third printing row area A2 and A3, a composition included in ink may not be precipitated in the inkjet head IH. Accordingly, the composition included in ink discharged through the inkjet head IH may have a normal concentration.

In the disclosure, after discharging ink to the first and second printing row areas A1 and A2, ink may be discharged to the second and third printing row areas A2 and A3 while moving the inkjet head IH. Accordingly, a concentration of the composition included in ink discharged to the second printing row area A2 may be compensated.

Specifically, in case that ink is discharged to the first and the second printing row areas A1 and A2, the second printing head P2 of the inkjet head IH may discharge ink to the second printing row area A2 to fill half of the opening in the second printing row area A2. In case that ink is discharged to the second and third printing row areas A2 and A3 while moving the inkjet head IH, the first head P1 of the inkjet head IH may repeatedly discharge ink to the second printing row area A2 to fill another half of the opening in the second printing row area A2.

Accordingly, the concentration of the composition in ink filled in the opening may be lower relatively. So, the concentration of the composition in ink filled in the opening may be a normal concentration, and the stains may not be visually recognized, or the stains may be less visible in the second printing row area A2.

Figure 5:
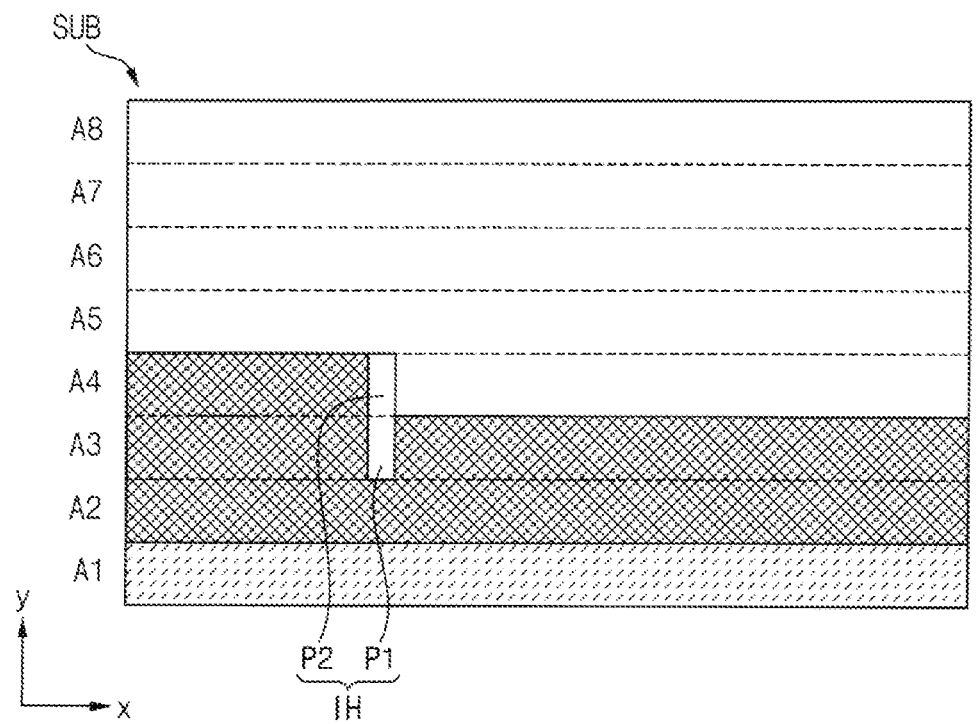
Figure 6:
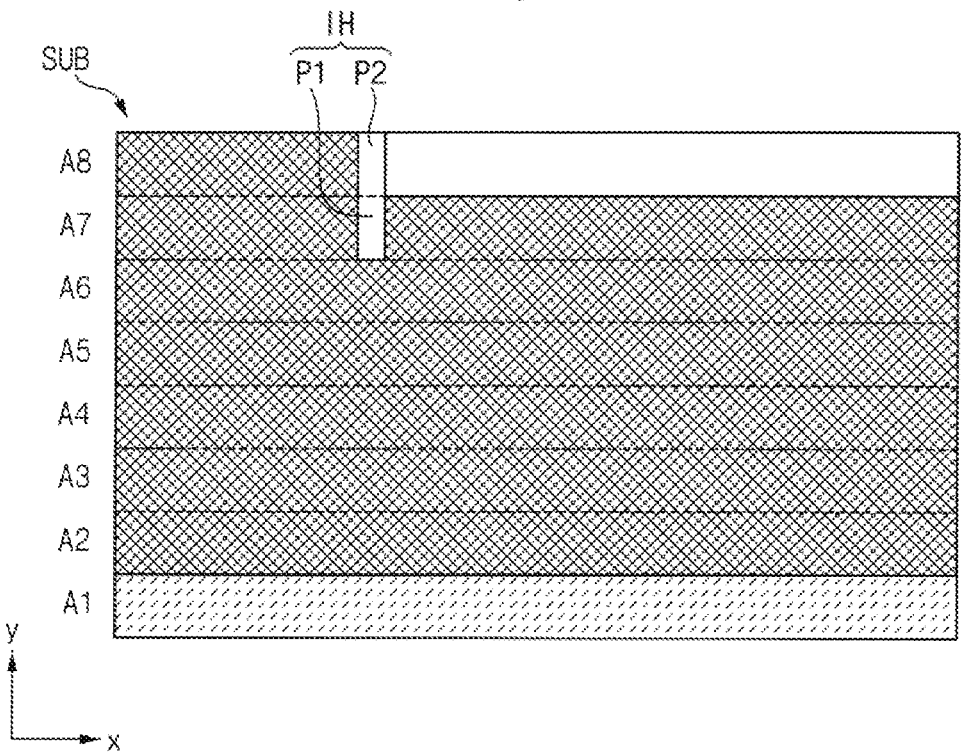
Figure 7:
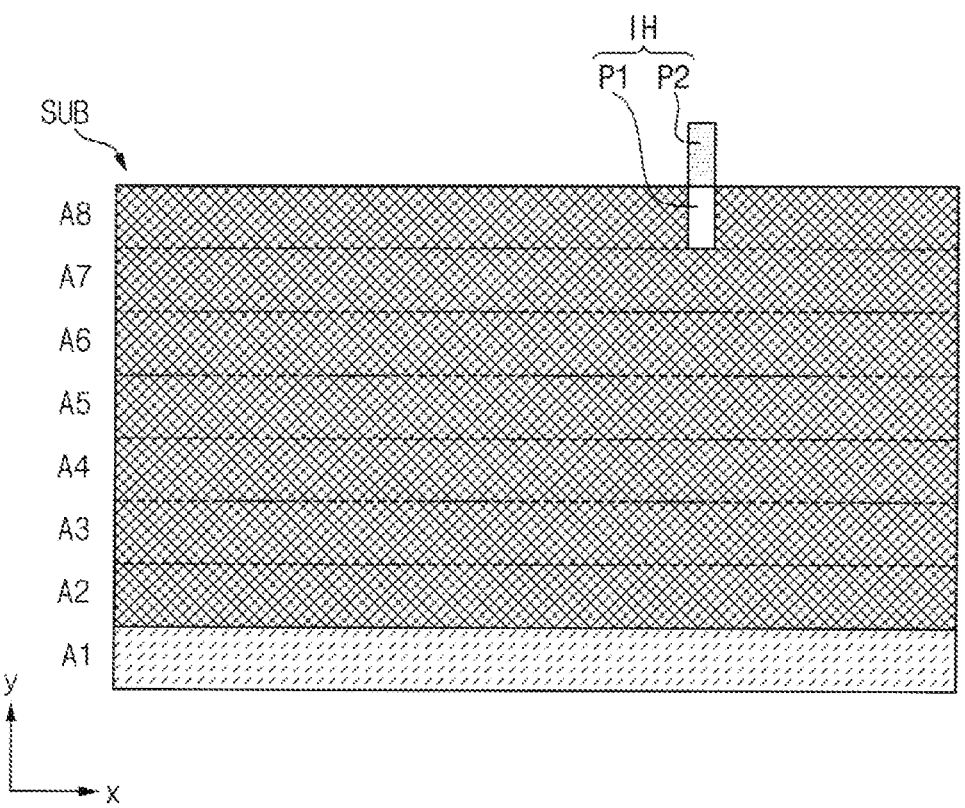

Referring to FIG. 5 and FIG. 7, after discharging ink to the second and third printing row areas A2 and A3, ink may be discharged to the third to eight printing row areas A3, A4, A5, A6, A7, and A8. The inkjet head IH may repeatedly move in the positive x-axis direction or the negative x-axis direction. The inkjet head IH may repeatedly move in the positive y-axis direction or the negative y-axis direction.

For example, steps of discharging ink to the third and fourth printing row areas A3 and A4, discharging ink to the fourth and fifth printing row areas A4 and A5, discharging ink to the fifth and sixth printing row areas A5 and A6, discharging ink to the sixth and seventh printing row areas A6 and A7, discharging ink to the seventh and eighth printing row area A7 and A8, and discharging ink only to the eighth printing row area A8 may be sequentially performed. So, in each of the printing row areas A3, A4, A5, A6, A7, and A8, a step of discharging ink through the second head P2 and a step of discharging ink through the first head P1 may be sequentially performed.

For example, in case that ink is discharged to the seventh and eighth printing row areas A7 and A8, the first head P1 of the inkjet head IH may discharge ink to the seventh printing row area A7, and the second head P2 of the inkjet head IH may discharge ink to the eighth printing row area A8.

For example, in case that ink is discharged only to the eighth printing row area A8, the first head P1 of the inkjet head IH may discharge ink to the eighth printing row area A8, and the second head P2 of the inkjet head IH may not discharge ink. During discharging ink only to the eighth printing row area A8, since the second head P2 does not discharge ink, a composition included in ink in the second head P2 may be precipitated. During discharging ink only to the eight printing row area A8, since the first head P1 discharges ink, a composition included in ink in the first head P1 may not be precipitated.

Figure 8:
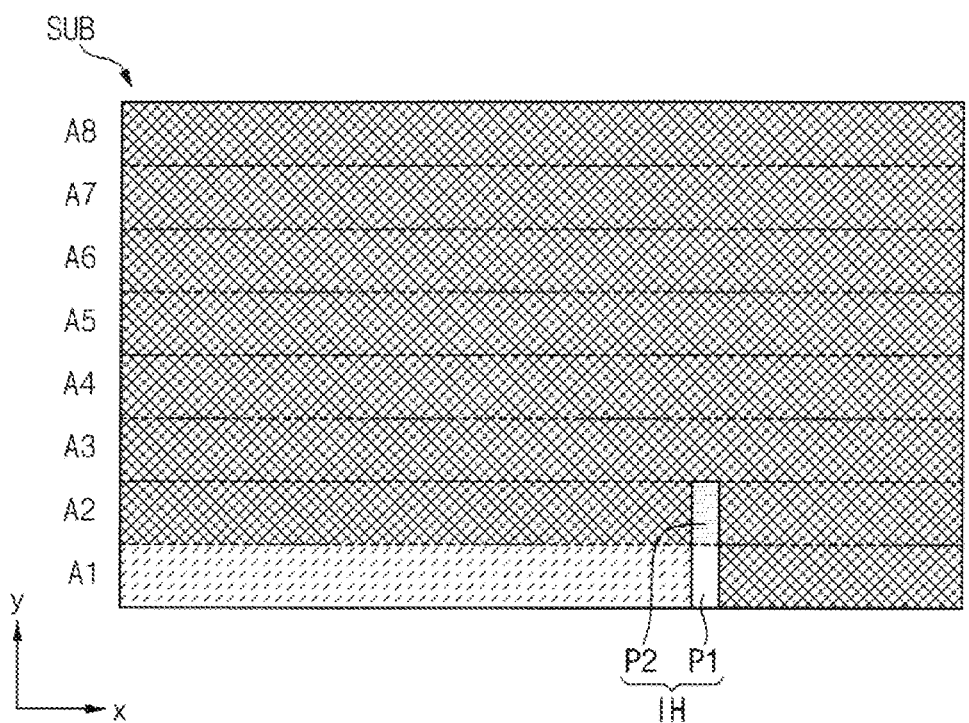

Referring to FIG. 8, after discharging ink only to the eighth printing row area A8, ink may be discharged only to the first printing row area A1 while moving the inkjet head IH.

In an embodiment, in case that ink is discharged only to the first printing row area A1, only the first head P1 of the inkjet head IH may discharge ink. For example, in case that ink is discharged only to the first printing row area A1, the first head P1 may discharge ink to the first printing row area A1, and the second head P2 may not discharge ink.

In the disclosure, after discharging ink only to the eighth printing row area A8, ink may be discharged only to the first printing row area A1 while moving the inkjet head IH. Accordingly, a concentration of the composition included in ink discharged to the first print row area A1 may be compensated.

FIG. 9, FIG. 10, FIG. 11, and FIG. 12 are schematic diagrams for explaining an inkjet printing method according to another embodiment of the disclosure. Explanations of the same configuration as in FIG. 1 to FIG. 8 may be omitted.

Referring to FIG. 9, FIG. 10, FIG. 11, and FIG. 12, by performing steps of positioning an inkjet head IH on a substrate SUB and discharging ink while moving the inkjet head IH, ink may be discharged to the substrate SUB. The substrate SUB may be substantially similar to the substrate SUB described with reference to FIG. 1 and FIG. 2.

The substrate SUB may include first to eight printing row areas A1, A2, A3, A4, A5, A6, A7 and A8. Each of the first to eighth printing row areas A1, A2, A3, A4, A5, A6, A7 and A8 may extend along a row direction (for example, x-axis direction), and may be arrayed in a column direction (for example, y-axis direction).

Openings (for example, the openings OP1, OP2, and OP3 described with reference to FIG. 1 and FIG. 2) may be formed in each of the first to eighth printing row areas A1, A2, A3, A4, A5, A6, A7 and A8.

FIG. 9 to FIG. 12 show an embodiment in which the substrate SUB includes first to eight printing row areas A1, A2, A3, A4, A5, A6, A7 and A8, but the number of printing row areas included in the substrate SUB is not limited thereto. For example, the substrate SUB may include first to $n^{th}$ (where n may be a natural number of 4 or more) printing row areas.

The inkjet head IH may include a first head P1, a second head P2 adjacent to the first head P1, and the third head P3 adjacent to the second head P2 and being apart from the first head P1. The first head P1 may be substantially similar to the first head P1 described with reference to FIG. 1. A structure of the second head P2 may be substantially similar to a structure of the first head P1. A structure of the third head P3 may be substantially similar to the structure of the first head P1. Accordingly, the inkjet head IH may simultaneously discharge ink to three adjacent printing row areas.

Figure 9:
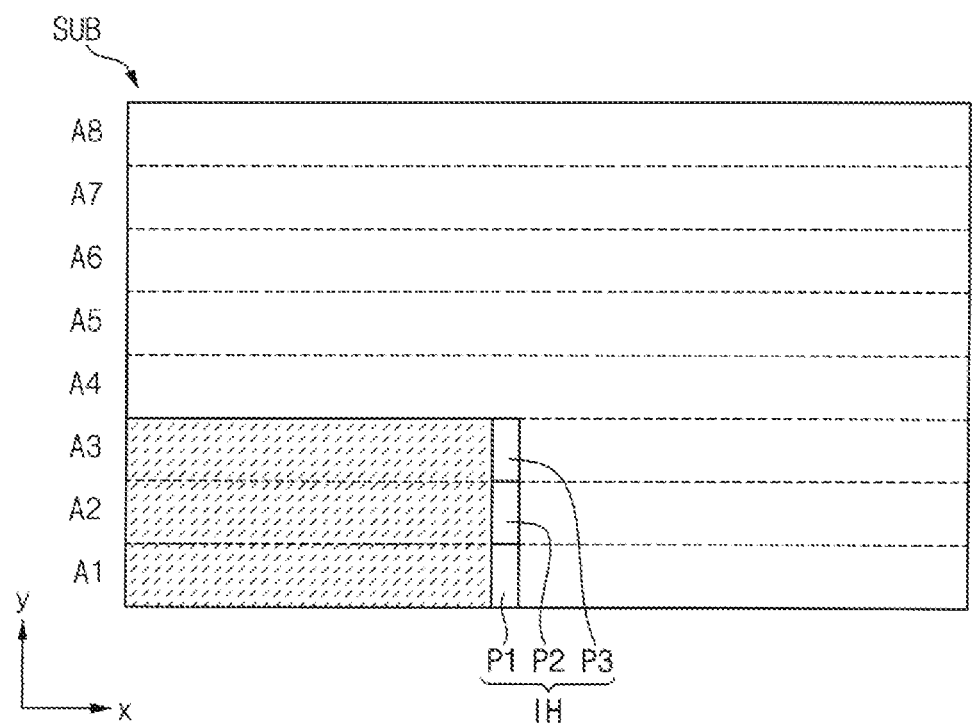
FIG. 9, FIG. 10, FIG. 11, and FIG. 12 are schematic diagrams for explaining an inkjet printing method according to another embodiment of the disclosure.

Referring to FIG. 9, after positioning the inkjet head IH for discharging ink to the substrate SUB including the first to eight printing row areas A1, A2, A3, A4, A5, A6, A7 and A8, ink may be discharged to the first, second, and third printing row areas A1, A2, and A3 among the first to eight printing row areas A1, A2, A3, A4, A5, A6, A7 and A8 while moving the inkjet head IH. For example, the first head P1 of the inkjet head IH may discharge ink to the first printing row area A1, the second head P2 of the inkjet head IH may discharge ink to the second printing row area A2, and the third head P3 of the inkjet head IH may discharge ink to the third printing row area A3. The inkjet head IH may repeatedly move in a positive x-axis direction or a negative x-axis direction. The inkjet head IH may repeatedly move in a positive y-axis direction or a negative y-axis direction.

In case that ink is discharged to the first, second, and third printing row areas A1, A2, and A3, a composition included in ink may be precipitated in the inkjet head IH. Accordingly, a concentration of the composition may be relatively increased in the ink discharged to the first, second, and third printing row areas A1, A2, and A3. In other words, the concentration of the composition may be relatively increased in ink filled in the openings included in the first, second, and third printing areas A1, A2, and A3. Accordingly, stains may be visually recognized in the first, second, and third areas A1, A2, and A3.

Figure 10:
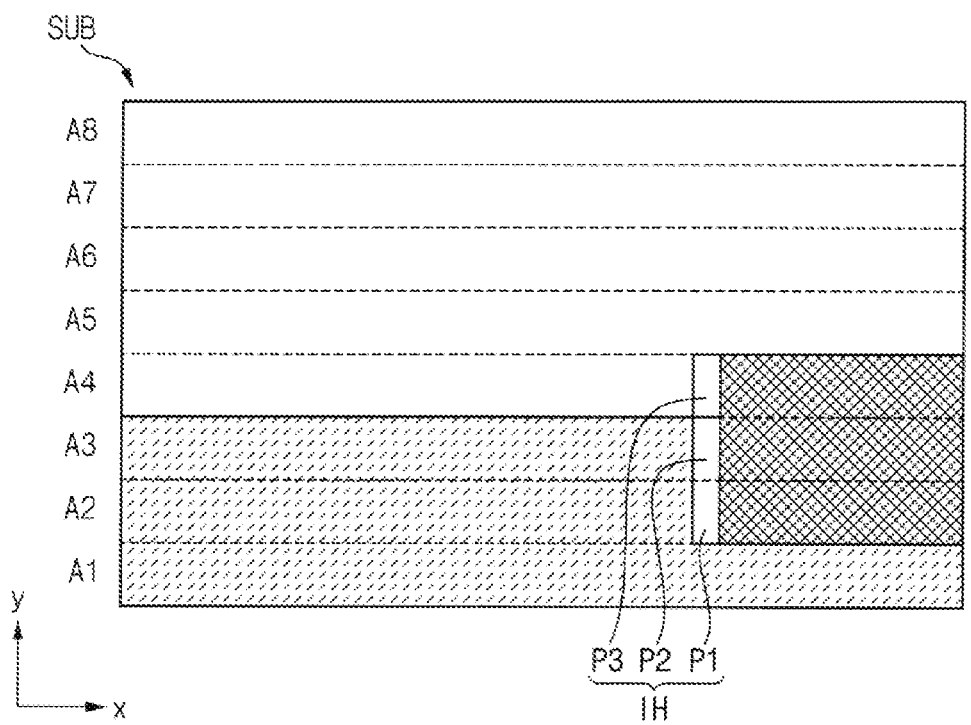

Referring to FIG. 10, after discharging ink to the first, second, and third printing row areas A1, A2, and A3, ink may be discharged to the second, third, and fourth printing row areas A2, A3, and A4. For example, the first head P1 of the inkjet head IH may discharge ink to the second printing row area A2, the second head P2 of the inkjet head IH may discharge ink to the third printing row area A3, and the third head P3 of the inkjet head IH may discharge ink to the fourth printing row area A4. The inkjet head IH may repeatedly move in the positive x-axis direction or the negative x-axis direction. The inkjet head IH may repeatedly move in the positive y-axis direction or the negative y-axis direction.

In case that ink is discharged to the second, third, and fourth printing row areas A2, A3, and A4, a composition included in ink may not be precipitated in the inkjet head IH. Accordingly, the composition included in ink discharged through the inkjet head IH may have a normal concentration. Accordingly, a concentration of the composition included in ink discharged to the second and third printing row areas A2 and A3 may be compensated.

Figure 11:
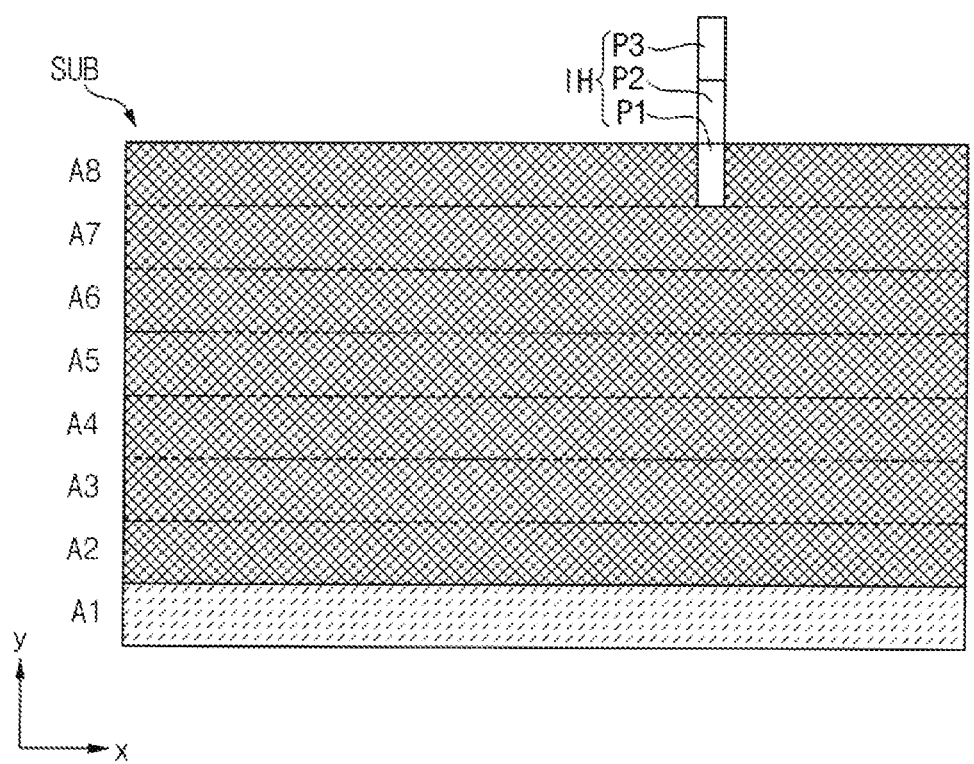

Referring to FIG. 11, after discharging ink to the second, third, and fourth printing row areas A2, A3, and A4, ink may be discharged only to the eighth printing row area A8. The inkjet head IH may repeatedly move in the positive x-axis direction or the negative x-axis direction. The inkjet head IH may repeatedly move in the positive y-axis direction or the negative y-axis direction.

For example, in case that ink is discharged only to the eighth printing row area A8, the first head P1 of the inkjet head IH may discharge ink to the eighth printing row area A8, and the second and third heads P2 and P3 may not discharge ink. During discharging ink only to the eighth printing row area A8, since the second and third heads P2 and P3 do not discharge ink, a composition included in ink in the second and third heads P2 and P3 may be precipitated. During discharging ink only to the eight printing row area A8, since the first head P1 discharges ink, a composition included in the ink in the first head P1 may not be precipitated.

Figure 12:
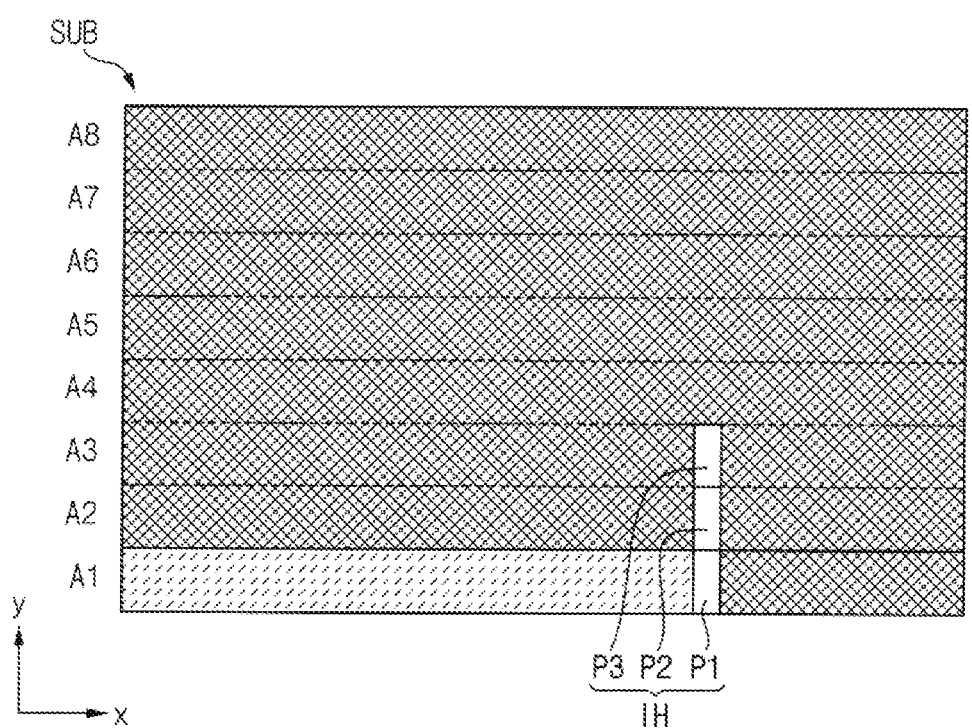

Referring to FIG. 12, after discharging ink only to the eighth printing row area A8, ink may be discharged only to the first printing row area A1 while moving the inkjet head IH.

In an embodiment, in case that ink is discharged only to the first printing row area A1, only the first head P1 of the inkjet head IH may discharge ink. For example, in case that ink is discharged only to the first printing row area A1, the first head P1 may discharge ink to the first printing row area A1, and the second and third heads P2 and P3 may not discharge ink.

In the disclosure, after discharging ink only in the eighth printing row area A8, ink may be discharged only to the first printing row area A1 while moving the inkjet head IH. Accordingly, a concentration of the composition included in ink discharged to the first print row area A1 may be compensated.

The disclosure may be applied to a manufacturing process of various display devices. For example, the disclosure may be applicable to a manufacturing process of various display devices such as display devices for vehicles, ships, and aircraft, portable communication devices, display devices for exhibition or information transmission, medical display devices, etc.

Although inkjet printing methods according to embodiments have been described with reference to the drawings, the illustrated embodiments are examples, and may be modified and changed by a person having ordinary skill in the art without departing from the technical spirit of the disclosure.

What is claimed is:

1. An inkjet printing method comprising:
    moving an inkjet head to discharge ink to a substrate including printing row areas;
    discharging ink to a first printing row area and a second printing row area among the printing row areas;
    discharging ink to a third printing row area among the printing row areas and the second printing row area; and
    discharging ink only to the first printing row area, wherein the ink contains at least a wavelength converting particle and a light scattering element.

2. The inkjet printing method of claim 1, further comprising:
    discharging ink to an $n-1^{th}$ printing row area and an $n^{th}$ printing row area among the printing row areas, wherein n is an integer greater than 3.

3. The inkjet printing method of claim 2, further comprising:
    discharging ink only to the $n^{th}$ printing row area after the discharging of the ink to the $n-1^{th}$ printing row area and the $n^{th}$ printing row area.

4. The inkjet printing method of claim 3, wherein
    the ink is discharged to the $n-1^{th}$ printing row area through a first head of the inkjet head, and
    the ink is discharged to the $n^{th}$ printing row area through a second head of the inkjet head.

5. The inkjet printing method of claim 3, wherein in case that the ink is discharged only to the $n^{th}$ printing row area,
    the ink is discharged only through a first head of the inkjet head, and
    the ink is not discharged through a second head of the inkjet head.

6. The inkjet printing method of claim 5, wherein in case that the ink is discharged only to the first printing row area,
    the ink is discharged only through the first head of the inkjet head.

7. An inkjet printing method comprising:
    moving an inkjet head to discharge ink to a substrate including printing row areas;
    discharging ink to a first printing row area and a second printing row area among the printing row areas;
    discharging ink to a third printing row area among the printing row areas and the second printing row area;
    discharging ink only to the first printing row area;
    forming a first color filter, a second color filter, and a third color filter on the substrate; and
    forming a partition wall on the first color filter, the second color filter, and the third color filter, the partition wall including openings.

8. The inkjet printing method of claim 7, wherein
    the openings include a first opening, a second opening, and a third opening, and
    at least one of the openings is formed in at least one printing row area among the printing row areas.

9. The inkjet printing method of claim 8, wherein the openings are repeatedly arranged in the printing row areas.

10. The inkjet printing method of claim 8, wherein
the inkjet head includes a blue ink printing head, a red ink printing head, and a green ink printing head,
the blue ink printing head discharges ink to the second opening,
the green ink printing head discharges ink to the third opening, and
the red ink printing head discharges ink to the first opening.

11. The inkjet printing method of claim 10, wherein the ink discharged to the openings includes particles.

12. The inkjet printing method of claim 11, wherein the particles include at least one of a wavelength converting particle and a scattering element.

13. The inkjet printing method of claim 12, wherein the blue ink printing head discharges ink including the scattering element.

14. The inkjet printing method of claim 12, wherein each of the green ink printing head and the red ink printing head discharges ink including the wavelength converting particle and the scattering element.

15. The inkjet printing method of claim 12, wherein the scattering element includes titanium oxide.

16. The inkjet printing method of claim 12, wherein the wavelength converting particle includes a quantum dot.

* * * * *